(12) United States Patent
Lubomirsky et al.

(10) Patent No.: US 9,659,803 B2
(45) Date of Patent: May 23, 2017

(54) ELECTROSTATIC CHUCK WITH CONCENTRIC COOLING BASE

(71) Applicant: Applied Materials, Inc., Santa Clara, CA (US)

(72) Inventors: Dmitry Lubomirsky, Cupertino, CA (US); Kyle Tantiwong, Fremont, CA (US); Samer Banna, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 523 days.

(21) Appl. No.: 14/162,510

(22) Filed: Jan. 23, 2014

(65) Prior Publication Data

US 2014/0209596 A1 Jul. 31, 2014

Related U.S. Application Data

(60) Provisional application No. 61/756,599, filed on Jan. 25, 2013.

(51) Int. Cl.
*H05B 3/68* (2006.01)
*H01L 21/683* (2006.01)
*H01L 21/67* (2006.01)

(52) U.S. Cl.
CPC .......... *H01L 21/6831* (2013.01); *H01L 21/67* (2013.01); *H01L 21/67098* (2013.01)

(58) Field of Classification Search
CPC .... H01L 21/683–21/6831; H01L 21/67; H01L 21/67103; H01L 21/67098; H01L 21/67248

(Continued)

(56) References Cited

U.S. PATENT DOCUMENTS 6,753,601 B2 * 6/2004 Hiramatsu ............ C04B 41/009
257/701
6,951,587 B1 * 10/2005 Narushima ......... C23C 16/4586
118/728

(Continued)

FOREIGN PATENT DOCUMENTS

EP     0 779 142 A1   6/1997
JP    2003-324095 A   11/2003

OTHER PUBLICATIONS

PCT Notification of Transmittal of the International Search Report and the Written Opinion of the International Searching Authority for International Application No. PCT/US2013/078244 dated Apr. 24, 2014; 12 total pages.

*Primary Examiner* — Sang Y Paik
(74) *Attorney, Agent, or Firm* — Patterson + Sheridan, LLP

(57) ABSTRACT

Embodiments of the present disclosure generally provide apparatus and method for cooling a substrate support in a uniform manner. One embodiment of the present disclosure provides a cooling assembly for a substrate support. The cooling assembly includes a cooling base having a first side for contacting the substrate support and providing cooling to the substrate support, a diffuser disposed on a second side of the cooling base, wherein the diffuser defines a plurality of cooling paths for delivering a cooling fluid towards the cooling base in a parallel manner, and an inlet/outlet plate disposed under the diffuser, wherein the inlet/outlet plate is provides an interface between the diffuser and an inlet and outlet of a cooling fluid.

19 Claims, 10 Drawing Sheets

(58) Field of Classification Search
USPC .................... 219/444.1–465.1; 118/724, 725
See application file for complete search history.

(56) References Cited

U.S. PATENT DOCUMENTS

| | | | |
|---|---|---|---|
| 7,763,831 B2* | 7/2010 | Morioka | H01L 21/67103 118/724 |
| 7,771,564 B2* | 8/2010 | Yokogawa | H01J 37/32431 118/715 |
| 8,106,335 B2* | 1/2012 | Murakami | C23C 16/4586 219/444.1 |
| 2001/0045269 A1 | 11/2001 | Yamada | |
| 2008/0144251 A1 | 6/2008 | Tao et al. | |
| 2009/0159566 A1* | 6/2009 | Brillhart | C23C 16/4586 216/58 |
| 2010/0193501 A1 | 8/2010 | Zucker et al. | |
| 2012/0091104 A1 | 4/2012 | Tavassoli et al. | |

* cited by examiner

ELECTROSTATIC CHUCK WITH CONCENTRIC COOLING BASE

CROSS-REFERENCE TO RELATED APPLICATIONS

This application claims benefit of U.S. Provisional Application Ser. No. 61/756,599, filed Jan. 25, 2013, which is incorporated herein by reference.

BACKGROUND

Field

Embodiments of the present disclosure generally relate to apparatus and methods for supporting a semiconductor substrate during fabrication. More particularly, embodiments of the present disclosure relate to apparatus and method for controlling the temperature of a heated substrate support.

Description of the Related Art

During manufacturing of semiconductor devices, a substrate is usually secured and supported by a substrate support in a processing chamber, where deposition, etching, thermal processing may be performed to the substrate. Substrates supports, such as electrostatic chucks, usually include embedded heater and attached to a cooling base to heat and control the temperature of the substrate during processing. Because processing uniformity is one of the constant goal for semiconductor processing, it is desirable to substrate supports that provide thermal uniformity.

Traditional cooling base for substrate supports use serial type of cooling path where cooling fluid flows through a cooling channel distributed at different regions of the cooling base. However, such serial type of cooling causes thermal non-uniformity in the substrate support, especially thermal azimuthal non-uniformity. Azimuthal thermal non-uniformity cannot be sufficiently compensated with hardware, such as adjustable heating element or secondary cooling.

Therefore, there is a need of apparatus and methods for improved temperature control of a substrate support.

SUMMARY

Embodiments of the present disclosure generally provide apparatus and method for controlling the temperature of a substrate support.

One embodiment of the present disclosure provides a cooling assembly for a substrate support. The cooling assembly includes a cooling base having a first side for contacting the substrate support and providing cooling to the substrate support, a diffuser disposed on a second side of the cooling base, wherein the diffuser defines a plurality of cooling paths for delivering a cooling fluid towards the cooling base in a parallel manner, and an inlet/outlet plate disposed under the diffuser, wherein the inlet/outlet plate is provides an interface between the diffuser and an inlet and outlet for circulating fluid through the cooling assembly.

Another embodiment of the present disclosure provides a substrate support. The substrate support includes a substrate supporting plate having an upper surface for supporting one or more substrates thereon and a lower surface opposing the upper surface, and a cooling assembly attached to the lower surface of the substrate supporting plate. The cooling assembly may include a cooling base having a first side contacting the lower surface of the substrate supporting plate and providing cooling to the substrate supporting plate, a diffuser disposed on a second side of the cooling base, wherein the diffuser defines a plurality of cooling paths for delivering a cooling fluid towards the cooling base in a parallel manner, and an inlet/outlet plate disposed under the diffuser, wherein the inlet/outlet plate is provides an interface between the diffuser and an inlet and outlet for circulating fluid through the cooling assembly.

Yet another embodiment of the present disclosure provides a method for providing cooling to a substrate support. The method includes flowing a cooling fluid into an inlet of an inlet/outlet plate of a cooling assembly attached to the substrate support, and flowing the cooling fluid from the inlet/outlet plate to a plurality of cooling paths in a diffuser of the cooling assembly. The plurality of cooling paths delivers the cooling fluid towards a cooling base of the cooling assembly in a parallel manner and the cooling base is in direct contact with the substrate support. The method further includes returning the cooling fluid through a plurality of returning channels in the diffuser to an outlet of the inlet/outlet plate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
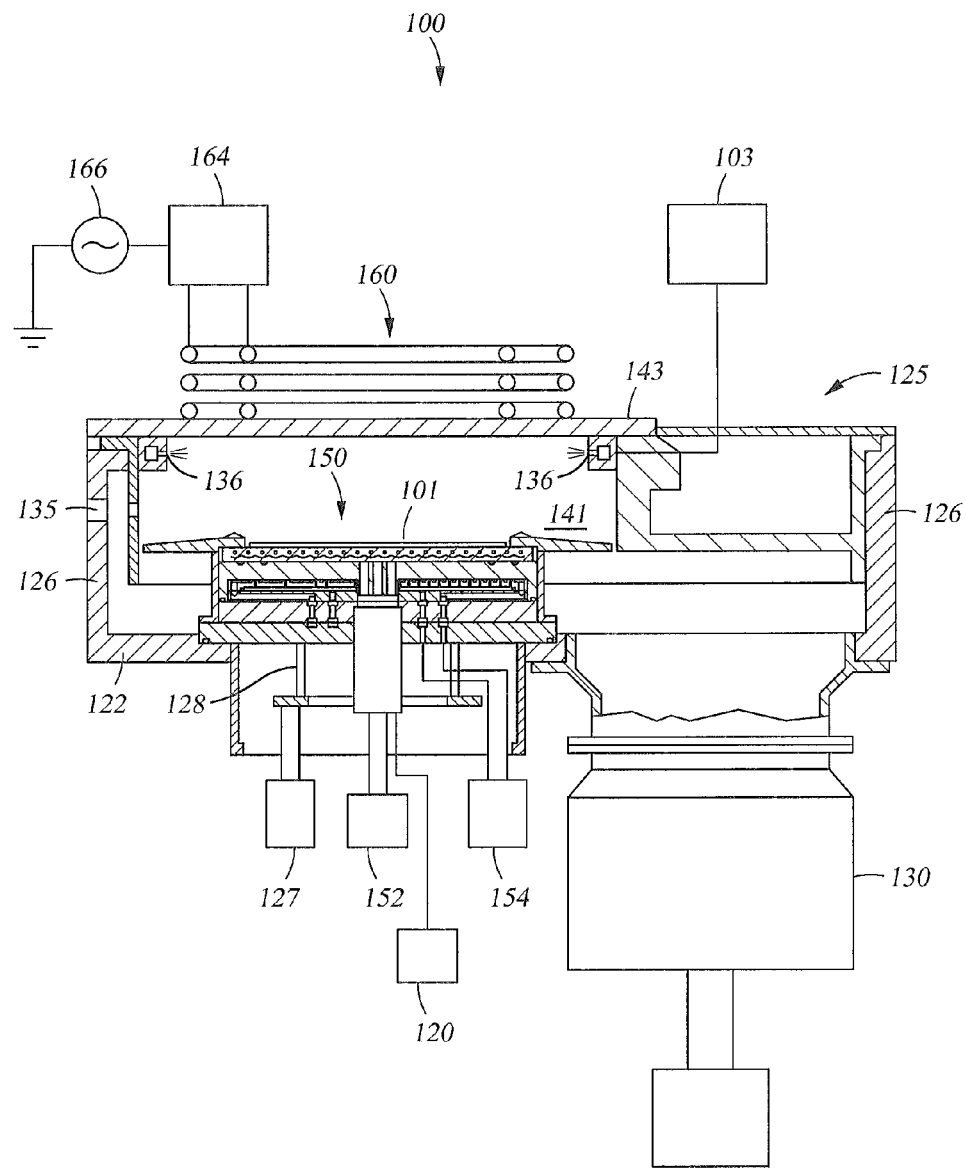
FIG. 1 is a schematic sectional view of a processing chamber according to one embodiment of the present disclosure.

Embodiments of the present disclosure provide apparatus and methods for controlling the temperature of a substrate support. Embodiments of the present disclosure provide a cooling assembly including a diffuser to form a plurality of cooling paths configured to deliver cooling fluid towards a cooling base in a parallel manner. The cooling assembly substantially eliminates azimuthal variations, therefore, improving control of temperature profile of the substrate support and the substrates being processed thereon. It is contemplated that embodiments of the present disclosure may also be used to heat the substrate and substrate support, if desired, by providing a heated fluid.

A cooling assembly according to embodiments of the present disclosure may include three parts joined together: a cooling base, a diffuser and an inlet/outlet plate. The cooling base is configured to physically contact a substrate support, such as an electrostatic chuck, to provide cooling. The cooling base may be bonded to the substrate support. The diffuser may be positioned below the cooling base. The diffuser is designed to provide even distribution of a cooling fluid across the surface of the cooling base. In one embodiment, the diffuser may include a plurality of vertical inlet channels, for directing a cooling fluid towards the cooling base. The diffuser may include a lower pressure reservoir fluidly connected to the plurality of vertical channels. The vertically channels may be small through holes. The small through holes may function as orifices to cause incoming fluid to build pressure and to uniformly flow upward through the through holes of the diffuser to the cooling base. The diffuser also directs the cooling fluid injected from the plurality of vertical channels to returning tunnels in the perimeter of the diffuser. The diffuser may also include notches to direct cooling fluid to flow radially outward. The diffuser may be bonded to the cooling base to create a sealed fluid volume. The inlet/outlet plate has discrete opening to bring in the incoming fluid, seal paths for the cooling liquid, sensors, and lift pins.

Cooling assemblies according the embodiments of the present disclosure provide improved thermal control. The diffuser with parallel vertical channels greatly reduces azimuthal non-uniformity compared to conventional cooling assemblies. Unlike uniformity along radial direction, azimuthal non-uniformity cannot be easily compensated in conventional designs. By arranging the returning channel or draining channels near the perimeter of the diffuser, thermal sensitivity among concentric zones may also be improved.

Substrate supports, such as multi-zone electrostatic chucks, having a cooling assembly with improved uniformity enable wide processing window under various processing conditions and plasma conditions. Combining the cooling assembly of the present disclosure with independently controllable heating zones along the radial direction, substrate supports can minimize thermally induced profile skews during substrate processing.

FIG. 1 is a schematic sectional view of a processing chamber 100 according to one embodiment of the present disclosure. The processing chamber 100 includes a substrate support 150 with improved temperature control according to one embodiment of the present disclosure. The processing chamber 100 may be configured to process a variety of substrates, such as semiconductor substrates and reticles, and accommodating a variety of substrate sizes.

The processing chamber 100 includes a chamber body 125 defining a processing volume 141. The chamber body 125 may include a bottom 122, sidewalls 126 and a lid 143 disposed over the sidewalls 126. A slit valve opening 135 is formed through the sidewall 126 to allow passage of the substrates and substrate transfer mechanism (not shown). A vacuum pump 130 is in fluid communication with the processing volume 141 and configured to maintain a low pressure environment within the processing volume 141. A plurality of nozzles 136 are positioned around an edge region of the processing volume 141. The plurality of nozzles 136 may be connected to a gas delivery system 103 and configured to inject one or more processing gases to the processing volume 141.

The processing chamber 100 may also include an antenna assembly 160 for generating a plasma inside the processing volume 141. In one embodiment, the antenna assembly 160 is disposed outside the chamber lid 143. The antenna assembly 160 may be coupled to a radio-frequency (RF) plasma power source 166 through a matching network 164. In the embodiment of FIG. 1, the antenna assembly 160 includes one or more solenoidal interleaved coil antennas disposed coaxially. Alternatively, the antenna assembly 160 may be other suitable arrangement.

The substrate support 150 is disposed in the processing volume 141. The substrate support 150 supports a substrate 101 during processing. A lift 127 may be coupled to lifting pins 128 to raise the substrate 101 from and to lower the substrate 101 down to the substrate support 150. The substrate support 150 may be an electrostatic chuck coupled to a chucking power source 120 to secure the substrate 101 thereon. In one embodiment, the substrate support 150 includes one or more embedded heating elements coupled to a heating power source 152 for heating the substrate 101 during processing. The substrate support 150 also includes cooling channels connected to a cooling fluid source 154 to provide cooling or heating and adjust temperature profile of the substrate 101 being processed. The substrate support 150 is further described in detail below.

Figure 2A:
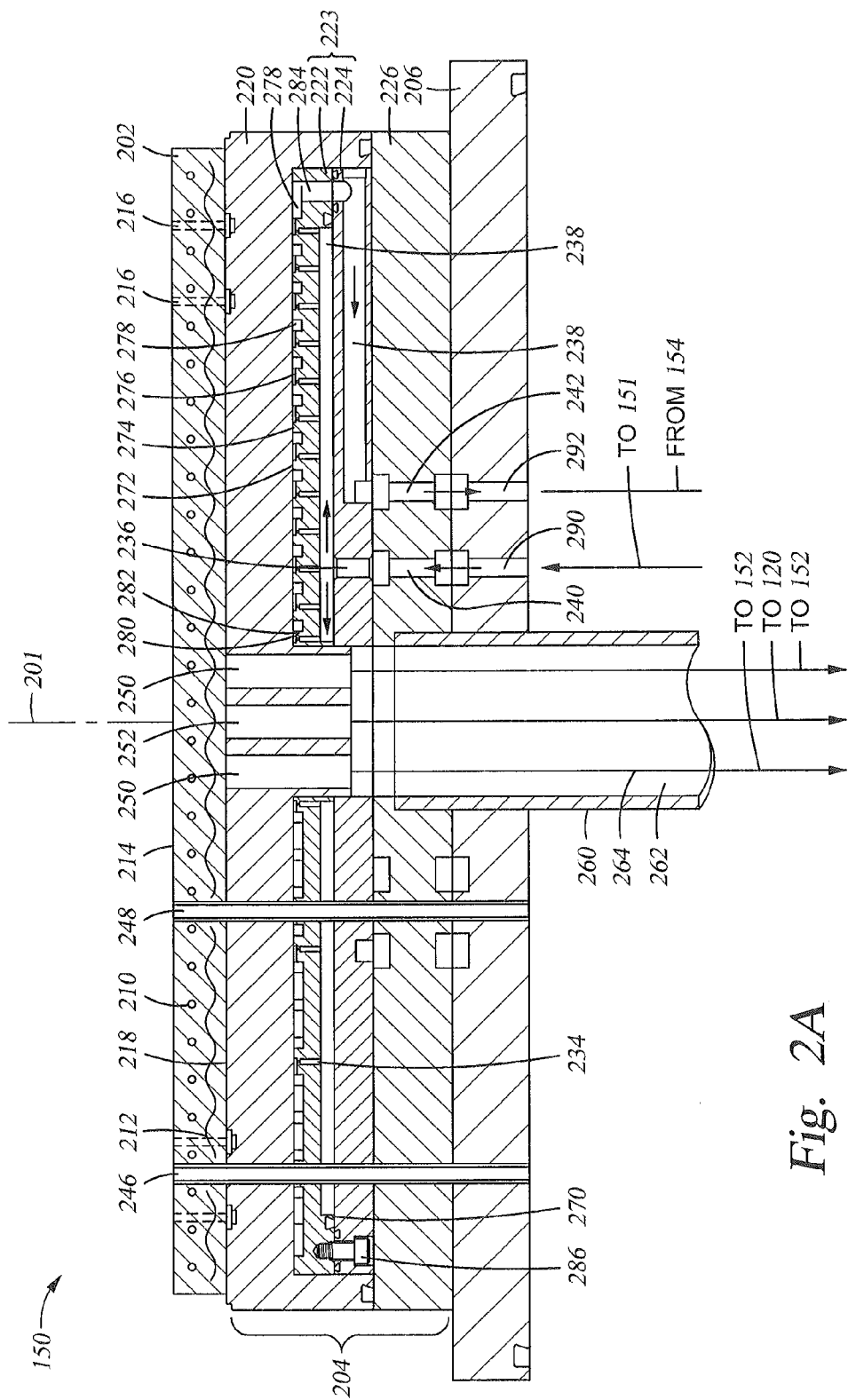
FIG. 2A is a sectional side view of a substrate support according to one embodiment of the present disclosure.

FIG. 2A is a sectional side view of the substrate support 150 according to one embodiment of the present disclosure. The substrate support 150 includes a substrate supporting plate 202 having an upper side 214 for supporting one or more substrates thereon. The substrate supporting plate 202 directly contacts the substrate being processed, provides temperature control to the substrate, and also includes a mechanism to secure the substrate thereon. The substrate support 150 further includes a cooling assembly 204 attached to a lower side 218 of the substrate supporting plate 202. The cooling assembly 204 is configured to provide cooling or heating to the substrate supporting plate 202 thus enhancing temperature control in the substrate supporting plate 202. In one embodiment, the cooling assembly 204 includes parallel cooling paths to provide uniform cooling to the substrate supporting plate 202. The substrate support 150 further includes a base 206 for supporting the substrate supporting plate 202 and the cooling assembly 204.

The substrate supporting plate 202 may be a substantially planar disk having a substrate supporting surface formed on the upper side 214. The substrate supporting plate 202 may be formed from dielectric material. One or more heating elements 210 may be embedded in the substrate supporting plate 202 to provide heating. The one or more heating elements 210 may be resistive heating elements. In one embodiment, the one or more heating elements 210 may be independently controlled and form two or more heating zones to achieve desired temperature profile, for example, uniform temperature profile or a temperature gradient across the upper side 214 and the substrate being processed thereon. In one embodiment, the one or more heating elements 210 form concentric heating zones. According to one embodiment, the one or more heating elements 210 form four concentric heating zones that are independently adjustable.

The substrate supporting plate 202 may also include an electrode 212. The electrode 212 may be connected to the chucking power source 120 to secure a substrate by electrostatic force. In one embodiment, the electrode 212 may include one or more conductive meshes embedded in the substrate supporting plate 202.

In one embodiment, the substrate supporting plate 202 may include fluid channels 216 open to the upper side 214. The fluid channels 216 may be connected to a gas source to supply a gas to a backside of the substrate during processing. For example, the fluid channels 216 may be connected to an inert gas source to provide an inert gas, such as argon, helium or nitrogen, to the back side of the substrate for cooling.

The cooling assembly 204 includes a cooling base 220, a diffuser 223 and an inlet/outlet plate 226 stacked and secured together. The cooling base 220 may be a disk formed from a thermal conductive material, for example a metal, such as aluminum or stainless steel. The cooling base 220 has an upper surface 230 that is attached to the lower side 218 of the substrate supporting plate 202 by solid contact to provide heat exchange with the substrate supporting plate 202. In one embodiment, the upper surface 230 of the cooling base 220 and the lower side 218 of the substrate supporting plate 202 may be bonded together by adhesive.

The diffuser 223 forms a plurality of cooling paths for circulating a cooling fluid (or a heated transfer fluid) from a cooling fluid source to and from the cooling base 220. The diffuser 223 may be attached to the cooling base 220 on a lower side 232 opposite the upper surface 230.

In one embodiment, the diffuser 223 may include an upper diffuser plate 222 stacked together with a lower diffuser plate 224. An upper surface 272 of the upper diffuser plate 222 is placed against the cooling base 220 and a lower surface 270 of the upper diffuser plate 222 is in contact with the lower diffuser plate 224.

The upper diffuser plate 222 includes a plurality of parallel channels 234 configured to deliver a cooling fluid towards the lower side 232 of the cooling base 220. In one embodiment, the plurality of parallel channels 234 may be a plurality of parallel through holes having substantially equal conductance and evenly distributed across the upper diffuser plate 222 to promote a uniform flow of cooling fluid through the diffuser 223. In one embodiment, the upper diffuser plate 222 may have a recess 268 formed from the lower surface 270. The plurality of parallel channels 234 are open to the recess 268. When the upper diffuser plate 222 is attached to the lower diffuser plate 224, the recess 268 serves as a reservoir (i.e. plenum) for supplying a cooling liquid to the plurality of parallel channels 234 so that each of the plurality of parallel channels 234 receives the cooling fluid under substantially the same conditions, such as the same temperature, and same pressure. Beneficially, since the parallel channels 234 receives cooling fluid at the same conditions uniformly across the cooling base 222, thereby providing uniform cooling across the width of the substrate.

In one embodiment, non-uniformity may be introduced to the distribution and/or dimension of the parallel channels 234 to accommodate structural non-uniformities in the substrate support 202, such as sensor openings 248 and lift pin openings 246. For example, the parallel channels 234 may have a different density, and/or a different size around the lift pin openings 246.

The upper surface 272 of the upper diffuser plate 222 may include a plurality of islands 274 protruding from an upper recess 278. Each of the plurality of islands 274 has a notch 280 facing radially outward. Each of the plurality of parallel channels 234 connects to a bottom 282 of the notch 280. Each of the plurality of parallel channels 234 delivers the cooling fluid from the recess 268 towards the cooling base 220. The radially outward facing notches 280 then direct the cooling fluid from the corresponding channel 234 radially outwards. A plurality of returning channels 284 are formed at an outer edge region of the upper diffuser plate 222. The plurality of returning channels 284 direct the cooling fluid away from the cooling base 220 towards the lower diffuser plate 224.

The lower diffuser plate 224 includes a plurality of inlet channels 236 for supplying the cooling fluid towards the recess 268 and the plurality of parallel channels 234 in the upper diffuser plate 222. The lower diffuser plate 224 also includes a plurality of outlet channels 238 coupled to the plurality of returning channels 284 for returning the cooling fluid from the plurality parallel channels 234 in the upper diffuser plate 222. The plurality of inlet channels 236 may be distributed, for example symmetrically, across the lower diffuser plate 224 to improve uniformity. Likewise, the plurality of outlet channels 238 may be distributed, for example symmetrically, across the lower diffuser plate 224 as well.

The inlet/outlet plate 226 is disposed below the diffuser 223 opposite the cooling base 220. The inlet/outlet plate 226 includes inlet adapting channels 240 for directing the cooling fluid entering the cooling assembly 204 from a single inlet to the plurality of inlet channels 236 in the diffuser 223. The inlet/outlet plate 226 also includes outlet adapting channels 242 for directing the cooling fluid from the plurality of outlet channels 238 in the diffuser 223 towards a single outlet of the cooling assembly. The cooling base 220, the diffuser 223 and the inlet/outlet plate 226 may be joined together such that the fluid paths between the inlet adapting channels 240 and outlet adapting channels 242 are sealed within the cooling assembly 204.

In one embodiment, the cooling base 220 may include a central recess 244 configured to receive the diffuser 223 therein. The inlet/outlet plate 226 may be attached to the cooling base 220 to close the central recess 244.

In one embodiment, the substrate support 150 may include three or more lift pin openings 246 formed through the substrate supporting plate 202, the cooling assembly 204 and the base 206 for receiving lift pins. The substrate support 150 may also include one or more sensor openings 248 for receiving one or more sensors, such as temperature sensors. The sensor openings 248 may be distributed at various radius of the substrate support 150 for measuring temperature of the substrate being processed at various radial locations. The substrate support 150 may also include a central shaft 260 having an inner volume 262 to accommodating leads 264 to power sources and/or controller. In one embodiment, the cooling base 220 may include a plurality of heating power openings 250 configured to receive leads to the heating elements 210 in the substrate supporting plate 202. The cooling base 220 may also include a chucking power opening 252 configured to receive a lead to the electrode 212. The heating power openings 250 and the chucking power openings 252 may be through holes formed near a central region of the cooling base 220.

Figure 2B:
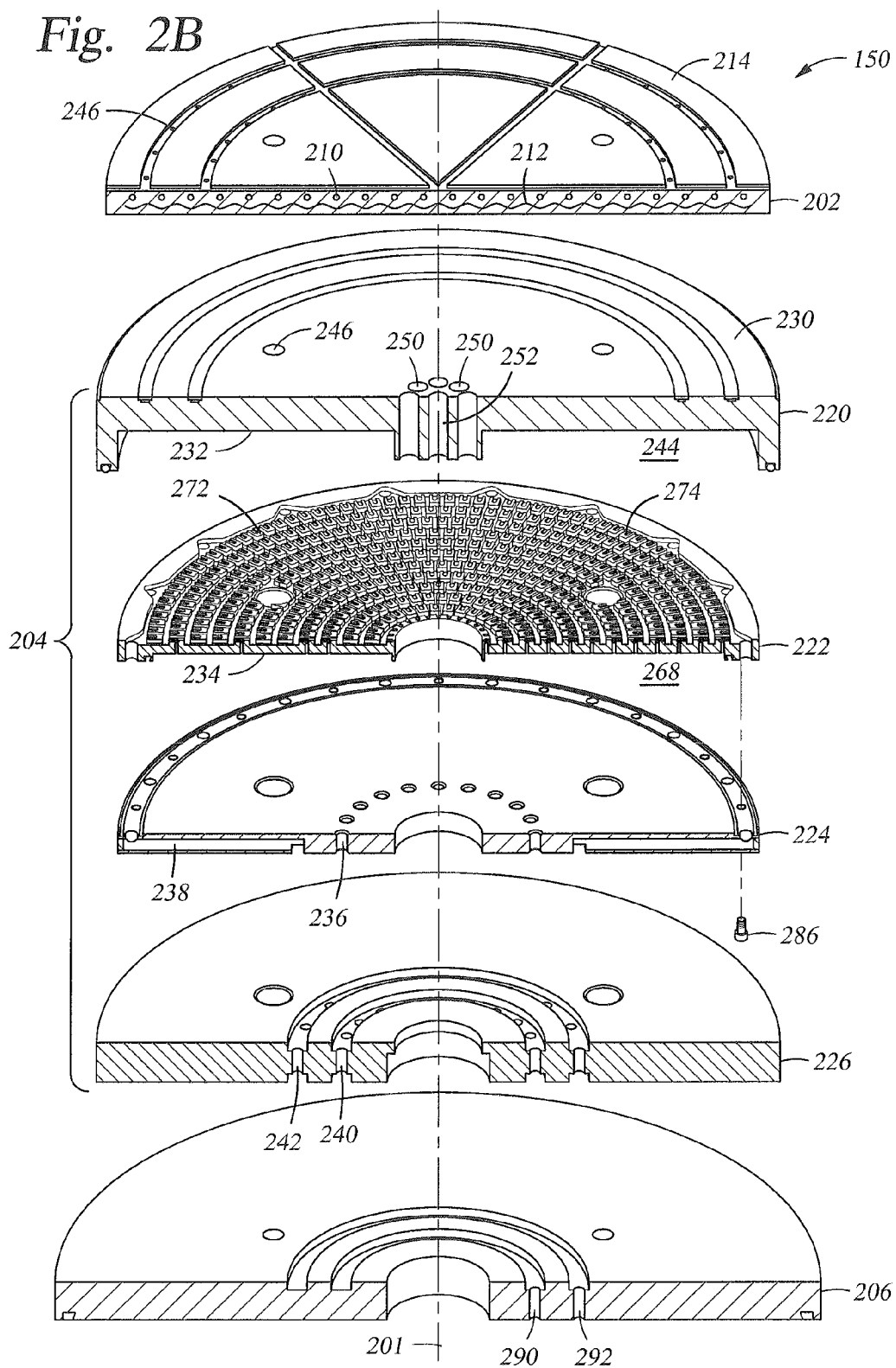
FIG. 2B is an exploded sectional view of the substrate support of FIG. 2A.

FIG. 2B is an exploded sectional view of the substrate support 150. The substrate supporting plate 202 may be secured to the cooling assembly 204 by adhesives. The upper diffuser plate 222 may be bonded to the lower side 232 of the cooling base 220 by adhesives. Screws 286 may be used to join the upper diffuser plate 222 and the lower diffuser plate 224. The inlet/outlet plate 226 joins the cooling base 220 at an edge region. A seal 288, such as an o-ring seal or a gasket, may be used between the inlet/outlet plate 226 and the cooling base 220 to seal the fluid paths formed in the cooling assembly 204. The cooling assembly 204 is further supported by the base 206. In one embodiment, the base 206 may include an inlet 290 and an outlet 292 for connecting with a cooling fluid source. As shown in FIG. 2B, the cooling paths formed in the cooling assembly 204 are symmetrical about a central axis 201. The symmetrical arrangement of cooling paths enables thermal uniformity within the cooling assembly 204 using cooling fluid from a single inlet.

Figure 2C:
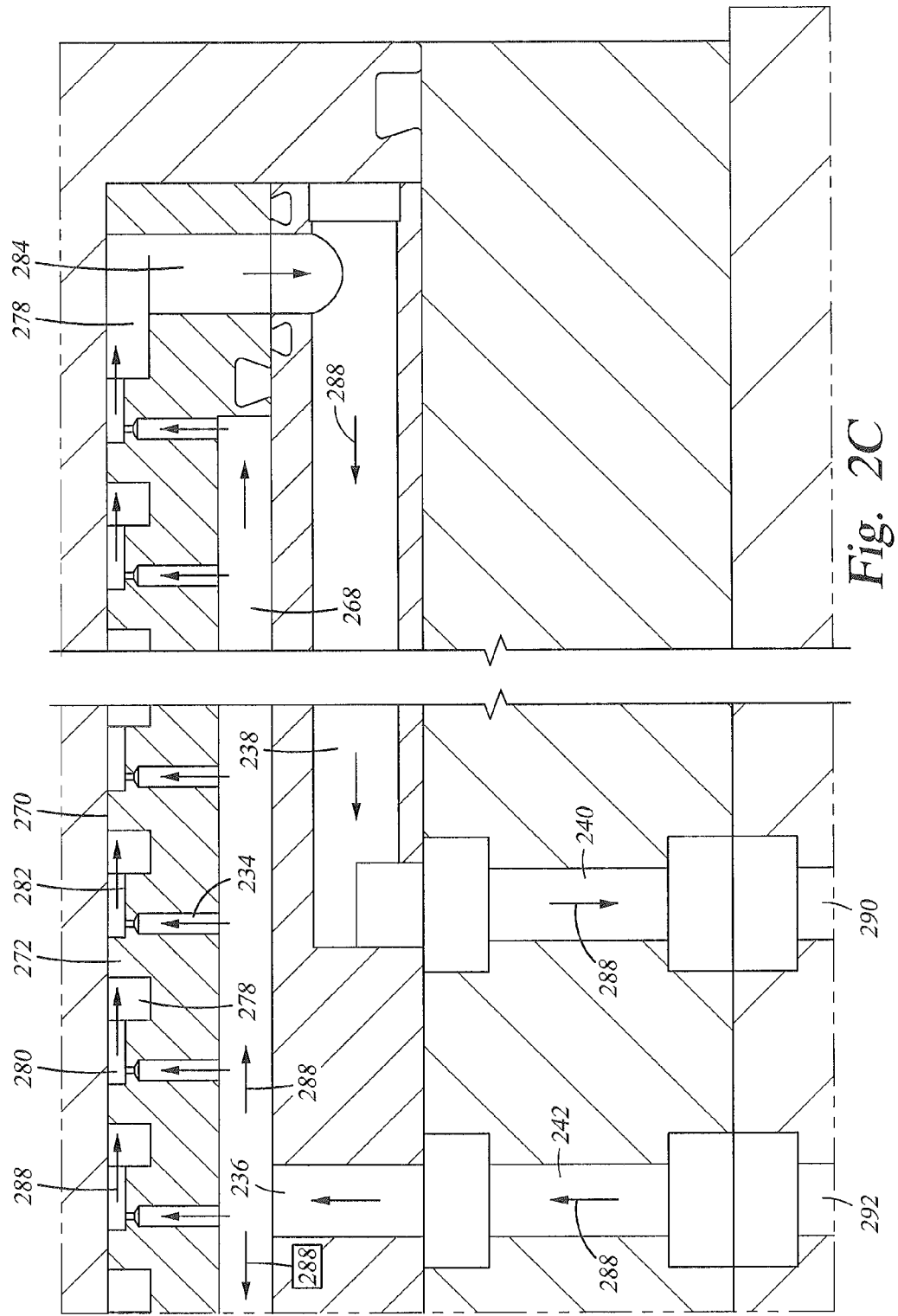
FIG. 2C is an enlarged partial sectional view of the substrate support of FIG. 2A.

Arrows 288 in FIG. 2C illustrate the paths of the cooling fluid during operation. The cooling fluid may enter a lower side of the cooling assembly 204, from a single inlet, through the inlet adapting channels 240 in the inlet/outlet plate 226. The inlet adapting channels 240 direct the cooling fluid to the plurality of inlet channels 236 in the lower diffuser plate 224. The cooling fluid then arrives at the recess 268 to form a uniform low pressure reservoir therein. The uniform low pressure in the recess 268 enables the cooling fluid to flow through the plurality of parallel channels 234 from the recess 268 towards the cooling base 220 in a uniform vertical manner, that is, with substantially the same flow rate through each of the plurality of parallel channels 234. Heat exchange may occur between the cooling fluid and the cooling base 220 after the cooling fluid exits the plurality of parallel channels 234. The cooling fluid then flows radially outward towards the plurality of returning channels 284 in the upper diffuser plate 222 and the outlet channels 238 in the lower diffuser plate 224, and then back to an outlet through the outlet adapting channels 242 in the inlet/outlet plate 226. The diffuser 223 provides parallel paths that allow a cooling fluid from a single inlet to arrive at different regions of the cooling base 220 at the substantially the same conditions, thus, improving temperature uniformity across the cooling base 220. Because the flow paths are substantially symmetrical about a central axis of the substrate support 150, azimuthal non-uniformity is in substantially reduced.

Figure 3A:
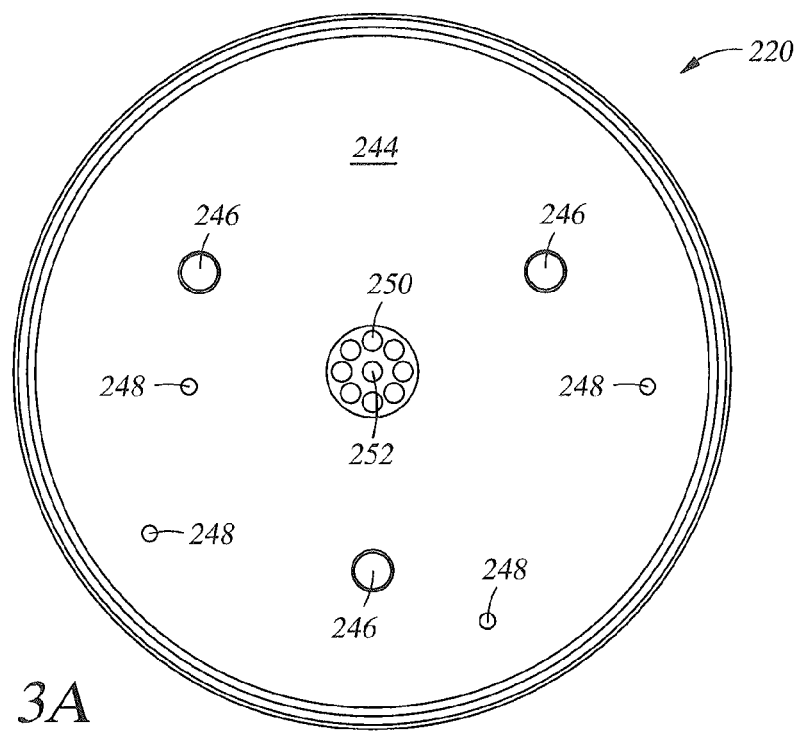
FIG. 3A is a schematic bottom view of a cooling base according to one embodiment of the present disclosure.
Figure 3B:
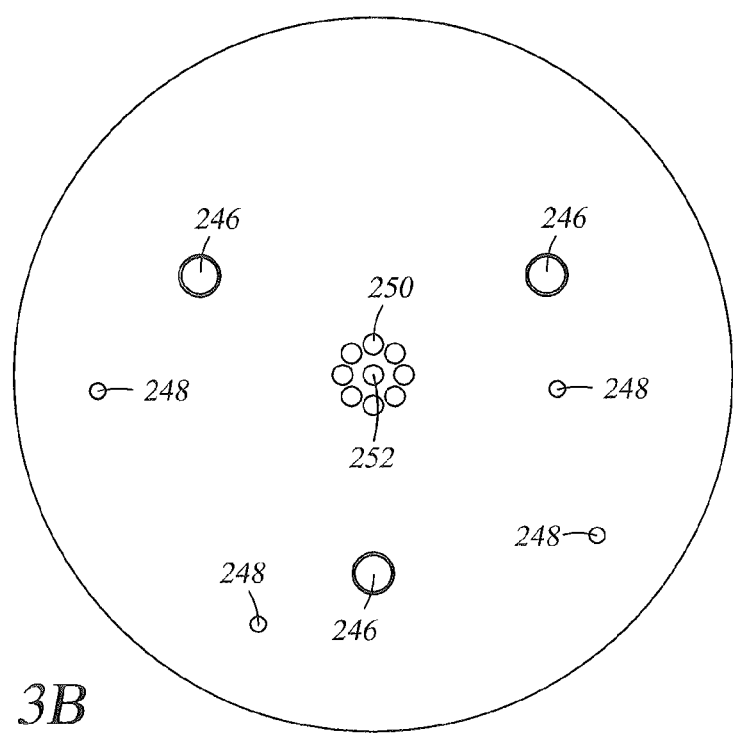
FIG. 3B is a schematic top view of the cooling base of FIG. 3A.

FIG. 3A is a schematic bottom view of the cooling base 220 according to one embodiment of the present disclosure. FIG. 3B is a schematic top view of the cooling base 220. The cooling base 220 may be a solid disk formed from thermal conductive materials, such as a metal, such as aluminum or stainless steel. The lift pin openings 246 and sensor openings 248 are formed through the cooling base 220. Multiple heating power openings 250 may be formed in the central region to accommodate leads to multiple heating elements 210 in the substrate supporting plate 202.

Figure 4A:
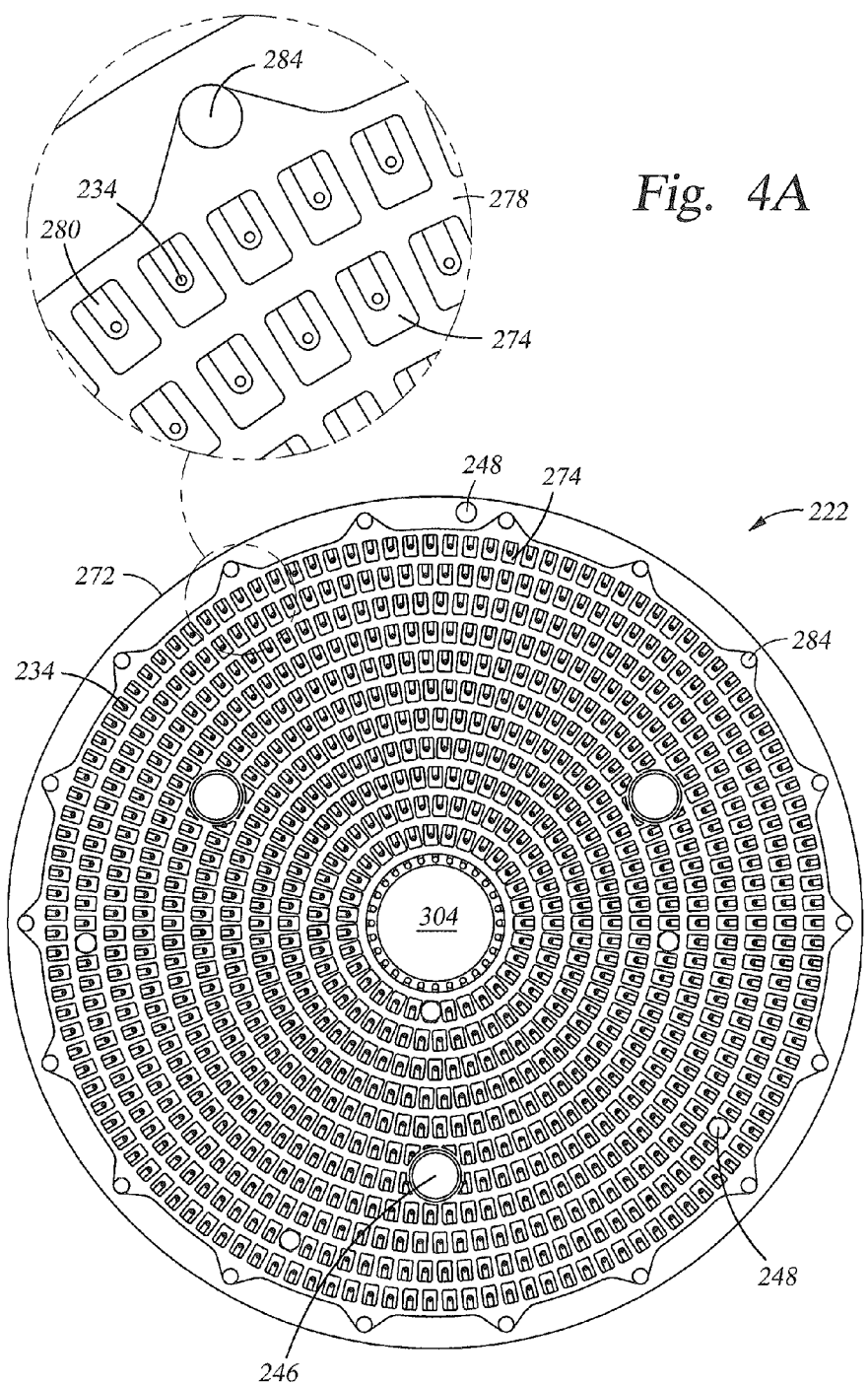
FIG. 4A is a schematic top view of an upper diffuser plate according to one embodiment of the present disclosure.
Figure 4B:
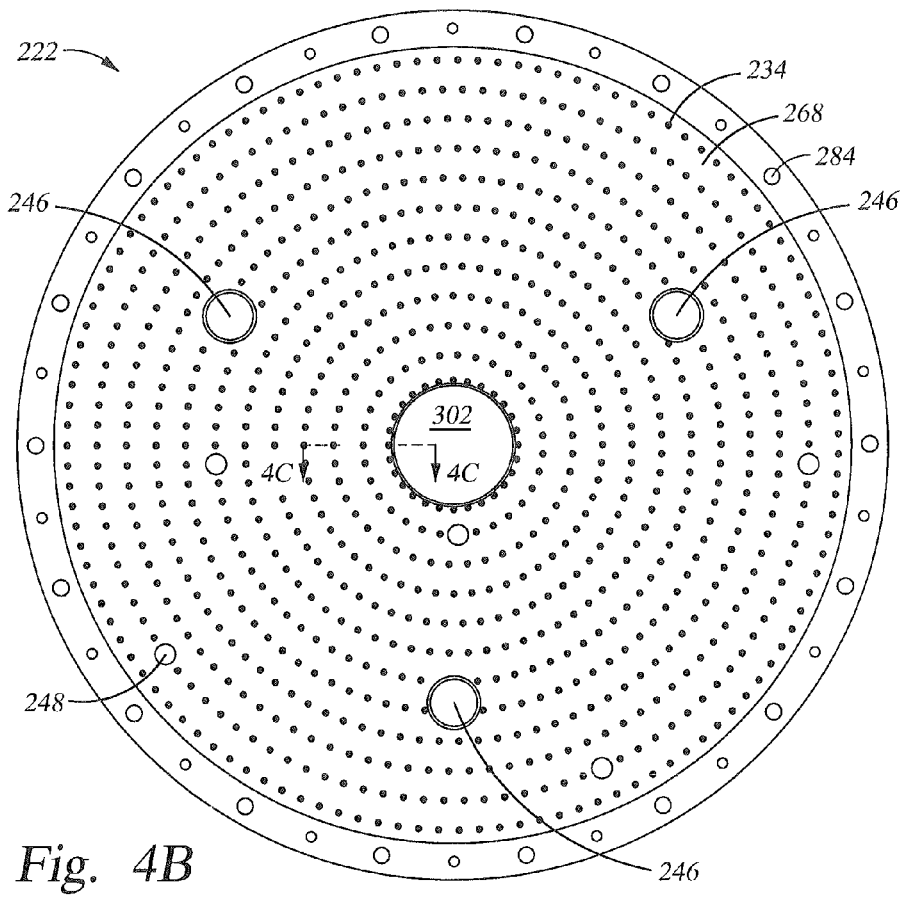
FIG. 4B is a schematic bottom view of the upper diffuser plate of FIG. 4B.

FIG. 4A is a schematic top view of the upper diffuser plate 222 according to one embodiment of the present disclosure. FIG. 4B is a schematic bottom view of the upper diffuser plate 222. The upper diffuser plate 222 may be a circular disk having the plurality of parallel channels 234 evenly distributed across the upper diffuser plate 222. In one embodiment, the upper diffuser plate 222 may include a central opening 302 for receiving a central portion of cooling base 202.

The upper recess 278 and the lower recess 268 are formed on opposite sides of the upper diffuser plate 222. The plurality of islands 274 are formed within the upper recess 278. Each island 274 has one of the parallel channels 234 formed therethrough connecting the upper recess 278 and the lower recess 268. The plurality of islands 274 may be evenly distributed within the upper recess 278. As shown in FIG. 4A, the plurality of islands 274 may be arranged in concentric circles to achieve azimuthal uniform cooling fluid delivery in azimuthal direction. Alternatively, the plurality of islands 274 may have other suitable arrangements to obtain desired fluid flow pattern. The returning channels 284 may be through holes formed at a periphery edge of the upper diffuser plate 222. The notch 280 in each island 274 may open radially outward from a center 304 of the upper diffuser plate 222 to direct the fluid flow radially outwards from each island 274 to the returning channels 284. In one embodiment, the plurality of returning channels 284 may be evenly distributed along the periphery edge of the upper diffuser plate 222.

Figure 4C:
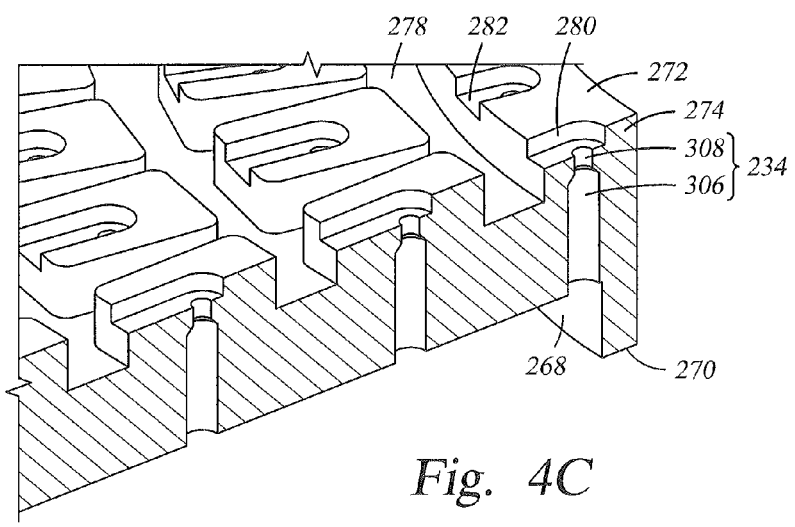
FIG. 4C is an enlarged partial sectional view of the upper diffuser plate of FIG. 4A.

FIG. 4C is an enlarged partial sectional view of the upper diffuser plate 222 showing the parallel channel 234 according to one embodiment of the present disclosure. Each parallel channel 234 may include a wide section 306 connected to a narrow section 308. The wide section 306 opens to the lower recess 268 and the narrow section 308 opens to the notch 280 in the island 274 in the upper recess 278. During operation, the narrow section 308 may function as flow orifice to restrict flow and build up pressure to project the cooling fluid upward towards the cooling base 202 attached to the upper diffuser plate 222.

Figure 5A:
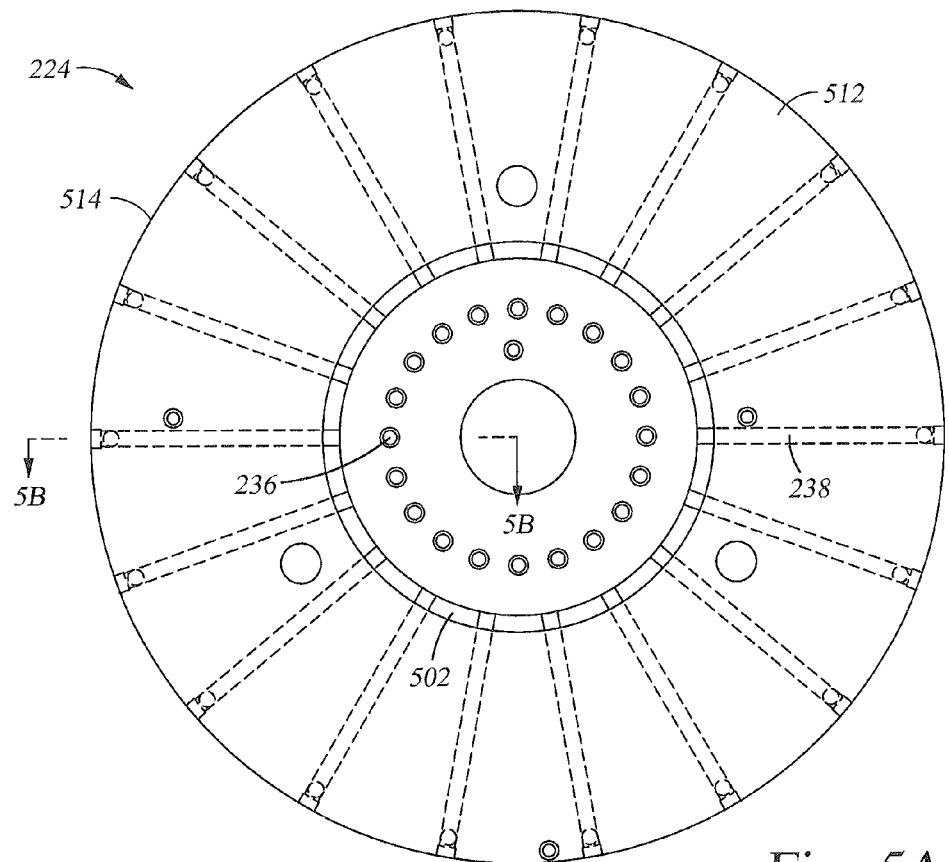
FIG. 5A is a schematic perspective view of a lower diffuser plate according to one embodiment of the present disclosure.
Figure 5B:
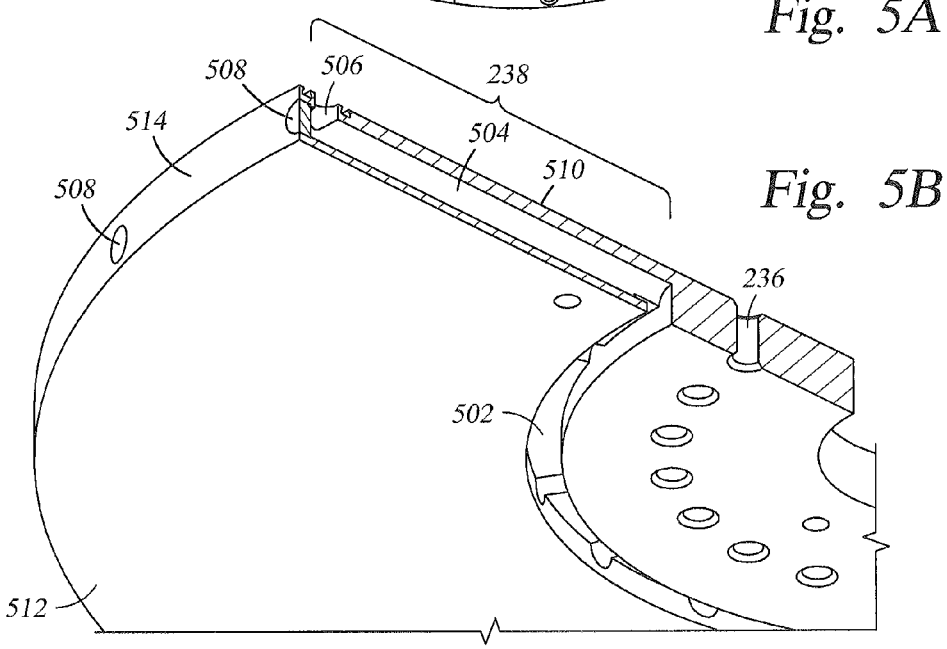
FIG. 5B is a schematic partial sectional view of the lower diffuser plate of FIG. 5A.

FIG. 5A is a schematic perspective view of the lower diffuser plate 224 according to one embodiment of the present disclosure. FIG. 5B is a schematic partial sectional view of the lower diffuser plate 224. The lower diffuser plate 224 may be a planar disk having the plurality of inlet channels 236 and the plurality of outlet channels 238 formed therein. The lower diffuser plate 224 has a first side 510 to be attached to the upper diffuser plate 222 and a second side 512 to be attached to the inlet/outlet plate 226. In one embodiment, the plurality of inlet channels 236 may be formed radially inward from the plurality of outlet channels 238. The plurality of inlet channels 236 may be a plurality of through holes connecting the first side 510 and the second side 512 and evenly distributed along a circle. The plurality of outlet channels 238 may include a ring shaped trench 502 formed in the second side 512, a plurality of horizontal tunnels 504 connecting the ring-shaped trench 502 to an outer side 514 of the lower diffuser plate 224, a plurality of end tunnels 506 connecting each horizontal tunnel 504 to the first side 510 near the outer side 514. When assembled, each of the end tunnels 502 matches with each of the returning channels 284 in the upper diffuser plate 222. In one embodiment, a stopper 508 may be inserted at an outer end of each horizontal tunnel 504 to retain the cooling fluid within the lower diffuser plate 224 during operation.

Figure 6A:
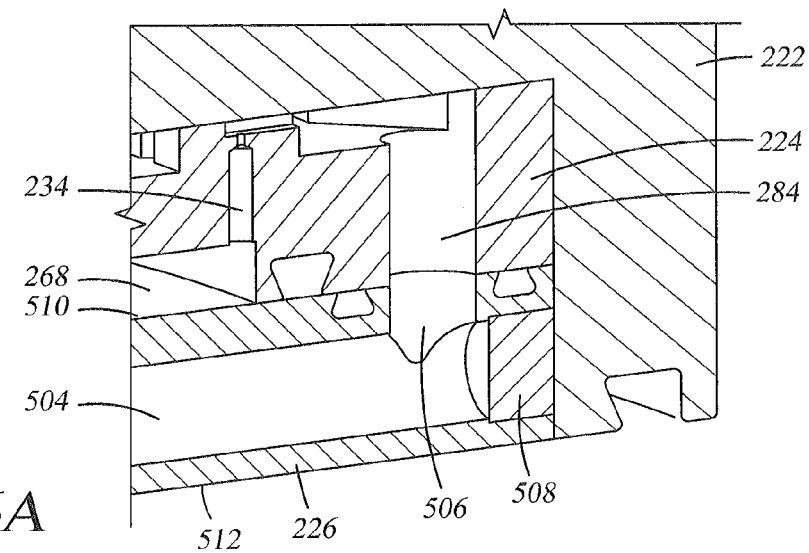
FIG. 6A is a schematic partial sectional view of the upper diffuser plate and the lower diffuser plate assembled together showing a cooling fluid returning path according to one embodiment of the present disclosure.
Figure 6B:
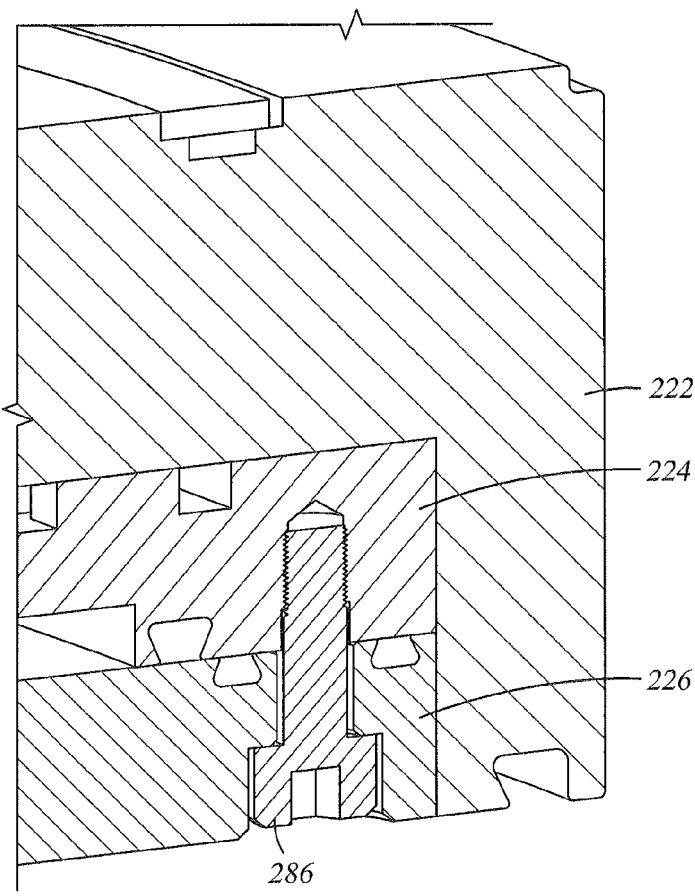
FIG. 6B is a schematic partial section view of the upper diffuser plate and the lower diffuser plate assembled together showing coupling details.

FIG. 6A is a schematic partial sectional view of the upper diffuser plate 222 and the lower diffuser plate 224 assembled together showing a cooling fluid returning path according to one embodiment of the present disclosure. FIG. 6B is a schematic partial section view of the upper diffuser plate 222 and the lower diffuser plate 224 assembled together by the plurality of screws 286.

Figure 7:
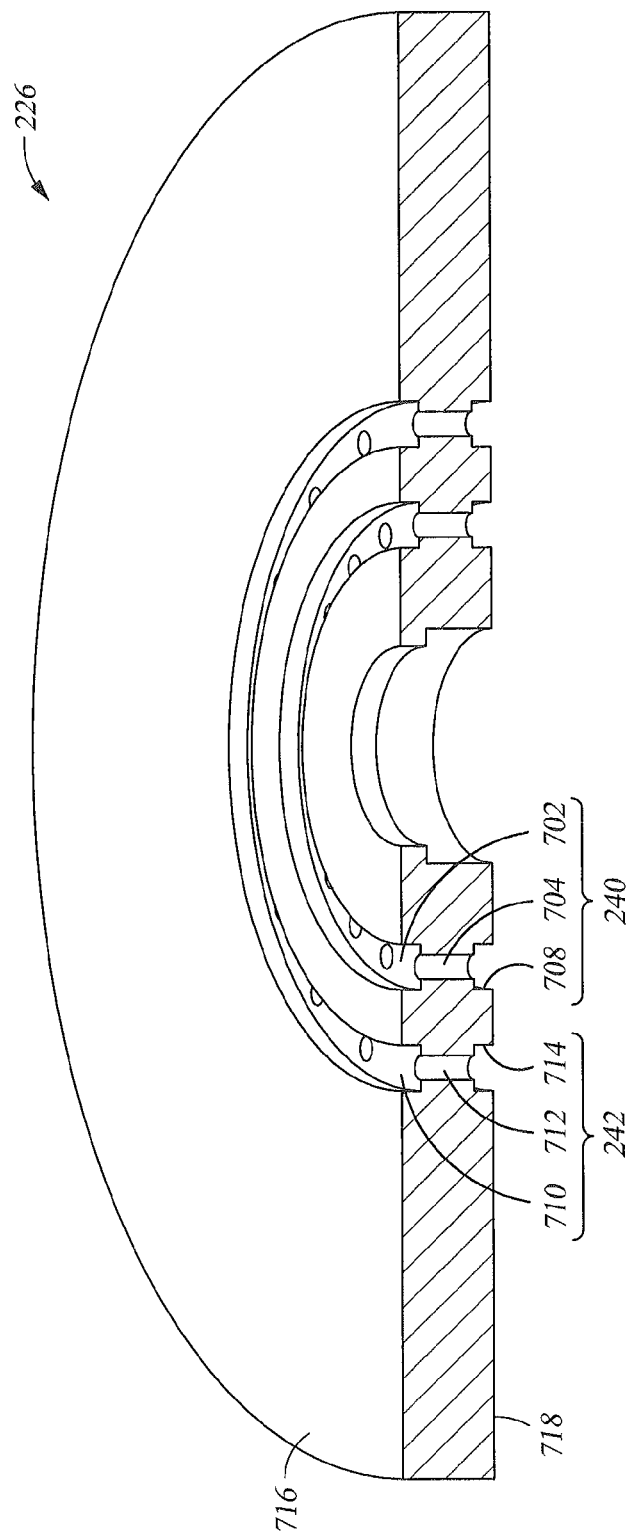
FIG. 7 is a schematic perspective sectional view of an inlet/outlet plate according to one embodiment of the present disclosure.

FIG. 7 is a schematic perspective sectional view of the inlet/outlet plate 226 according to one embodiment of the present disclosure. The inlet/outlet plate 226 may be a planar disk having a first side 716 and a second side 718. The inlet adapting channels 240 may be formed radially inward from the outlet adapting channels 242. In one embodiment, the inlet adapting channels 240 may include a circular channel 702 formed on the first side 716, a circular channel 708 formed on the second side 718, and a plurality of through holes 704 connecting the circular channels 702 and 708. When assembled, the plurality of inlet channels 236 of the lower diffuser plate 224 open to the circular channel 702. The circular channel 708 is configured to receive the incoming cooling fluid. The inlet adapting channels 240 allow the cooling fluid from a single inlet coupled to the circular channel 708 to become evenly distributed in the circular channel 702 before entering the diffuser 223.

The outlet adapting channels 242 may include a circular channel 710 formed on the first side 716, a circular channel 714 formed on the second side 718, and a plurality of through holes 712 connecting the circular channels 710 and 714. The circular channel 714 is configured to couple with an outlet for the cooling fluid. The outlet adapting channels 242 allows the cooling fluid to return to a single outlet coupled to the circular channel 714 in a symmetrical manner.

While the foregoing is directed to embodiments of the present disclosure, other and further embodiments of the disclosure may be devised without departing from the basic scope thereof, and the scope thereof is determined by the claims that follow.

The invention claimed is:

1. A cooling assembly for a substrate support, comprising:
a cooling base having a first side for contacting the substrate support and providing cooling to the substrate support;
a diffuser disposed on a second side of the cooling base, wherein the diffuser defines a plurality of cooling paths for delivering a cooling fluid towards the cooling base in a parallel manner and a plurality of returning tunnels disposed therethrough delivering the cooling fluid away from the cooling base; and
an inlet/outlet plate disposed under the diffuser, wherein the inlet/outlet plate provides an interface between the cooling paths of the diffuser and an inlet and the returning tunnels of the diffuser and an outlet of a cooling fluid wherein the inlet/outlet plate includes inlet adapting channels forming flow paths between a single inlet and a plurality of inlet channels in the diffuser, and outlet adapting channels forming flow paths between a single outlet and a plurality of returning tunnels in the diffuser.

2. The cooling assembly of claim 1, wherein the diffuser comprises:
an upper diffuser plate having a first side and a second side opposing the first side, wherein the first side is attached to the second side of the cooling base, a plurality of through holes connecting the first side to the second side, and each of the plurality of through holes is a portion of the plurality of cooling paths; and
a lower diffuser plate attached to the second side of the upper diffuser plate, wherein a fluid reservoir is formed between the upper diffuser plate and the lower diffuser plate, and each of the plurality of through holes opens to the fluid reservoir.

3. The cooling assembly of claim 2, wherein the upper diffuser plate has a first recess on the first side, a plurality of islands protrude from the first recess, and each of the plurality of through holes is formed in each of the plurality of islands.

4. The cooling assembly of claim 3, wherein the plurality of islands are arranged in concentric circles, and each of the plurality of islands has a notch opening radially outward, and the through hole opens at a bottom of the notch.

5. The cooling assembly of claim 4, wherein a plurality of returning tunnels are formed along a periphery edge of the upper diffuser plate.

6. The cooling assembly of claim 2, wherein the fluid reservoir is defined by a recess formed on the second side of the upper diffuser plate and the lower diffuser plate.

7. The cooling assembly of claim 6, wherein the lower diffuser plate includes a plurality of inlet channels open to the recess of the upper diffuser plate.

8. The cooling assembly of claim 7, wherein the lower diffuser plate includes a plurality of outlet channels formed radially outward from the plurality of inlet channel.

9. The cooling assembly of claim 8, where the plurality of outlet channels include a circular trench facing the inlet/outlet plate, a plurality of horizontal tunnels each connecting the circular trench to an outer side of the lower diffuser plate, and a plurality of end tunnels connecting each of the plurality of horizontal tunnels to the upper diffuser plate.

10. The cooling assembly of claim 2, wherein the upper diffuser plate and the lower diffuser plate are coupled together by a plurality of screws at a periphery region.

11. The cooling assembly of claim 1, wherein the plurality of cooling paths are symmetrical about a central axis of the cooling assembly.

12. A substrate support comprising:
a substrate supporting plate having an upper surface for supporting one or more substrates thereon and a lower surface opposing the upper surface; and
a cooling assembly attached to the lower surface of the substrate supporting plate, wherein the cooling assembly comprises:
a cooling base having a first side contacting the lower surface of the substrate supporting plate and providing cooling to the substrate supporting plate;
a diffuser disposed on a second side of the cooling base, wherein the diffuser defines a plurality of cooling paths for delivering a cooling fluid towards the cooling base in a parallel manner and a plurality of returning tunnels disposed through the diffuser delivering the cooling fluid away from the cooling base; and
an inlet/outlet plate disposed under the diffuser, wherein the inlet/outlet plate provides an interface between the cooling paths of the diffuser and an inlet and the returning tunnels of the diffuser and an outlet of a cooling fluid wherein the inlet/outlet plate includes inlet adapting channels forming flow paths between a single inlet and a plurality of inlet channels in the diffuser, and outlet adapting channels forming flow paths between a single outlet and a plurality of returning tunnels in the diffuser.

13. The substrate support of claim 12, wherein the diffuser comprises:
an upper diffuser plate having a first side and a second side opposing the first side, wherein the first side is attached to the second side of the cooling base, a plurality of through holes connecting the first side to the second side, and each of the plurality of through holes is a portion of the plurality of cooling paths; and a lower diffuser plate attached to the second side of the upper diffuser plate, wherein a fluid reservoir is formed between the upper diffuser plate and the lower diffuser plate, and each of the plurality of through holes opens to the fluid reservoir.

14. The substrate support of claim 13, wherein the substrate supporting plate comprises:

one or more heating elements; and an electrode for securing a substrate thereon by electrostatic force.

15. The substrate support of claim 14, wherein the heating elements are independently controllable.

16. The substrate support of claim 15, wherein the plurality of heating elements form multiple concentric heating zones.

17. The substrate support of claim 12, wherein the plurality of cooling paths are symmetrical about a central axis of the cooling assembly.

18. A method for providing cooling to a substrate support, comprising:

flowing a cooling fluid into an inlet of an inlet/outlet plate of a cooling assembly attached to the substrate support;

flowing the cooling fluid from the inlet/outlet plate to a plurality of cooling paths in a diffuser of the cooling assembly, wherein the inlet/outlet plate includes inlet adapting channels forming flow paths between a single inlet and a plurality of inlet channels in the diffuser and outlet adapting channels forming flow paths between a single outlet and a plurality of returning tunnels in the diffuser, and the plurality of cooling paths delivers the cooling fluid towards a cooling base of the cooling assembly in a parallel manner, and the cooling base is in direct contact with the substrate support; and returning the cooling fluid through a plurality of returning channels in the diffuser to an outlet of the inlet/outlet plate.

19. The method of claim 18, wherein each of the plurality of cooling paths includes a vertical channel formed in the diffuser towards, and the plurality of vertical channels are substantially evenly distributed in the diffuser.

\* \* \* \* \*